(12) United States Patent
Wiegman

(10) Patent No.: US 11,437,763 B1
(45) Date of Patent: Sep. 6, 2022

(54) SYSTEMS AND METHODS FOR AN ELECTRIC AIRCRAFT CHARGING CONNECTOR

(71) Applicant: BETA AIR, LLC, South Burlington, VT (US)

(72) Inventor: Herman Wiegman, South Burlington, VT (US)

(73) Assignee: BETA AIR, LLC, South Burlington, VT (US)

(*) Notice: Subject to any disclaimer, the term of this patent is extended or adjusted under 35 U.S.C. 154(b) by 0 days.

(21) Appl. No.: 17/515,503

(22) Filed: Oct. 31, 2021

(51) Int. Cl.
*H01R 13/66* (2006.01)
*G01R 31/66* (2020.01)
*H02J 7/00* (2006.01)

(52) U.S. Cl.
CPC ............. *H01R 13/66* (2013.01); *G01R 31/66* (2020.01); *H02J 7/0029* (2013.01); *H02J 7/0042* (2013.01); *B60L 2200/10* (2013.01)

(58) Field of Classification Search
CPC ....... H01R 13/66; G01R 31/66; H02J 7/0029; H02J 7/0042
USPC ................. 439/620.01, 620.21, 620.22, 912; 361/42–50
See application file for complete search history.

(56) References Cited

U.S. PATENT DOCUMENTS

| | | | |
|---|---|---|---|
| 7,371,091 B2 | 5/2008 | Kojori | |
| 9,075,098 B2 | 7/2015 | Schurman | |
| 9,153,982 B2 * | 10/2015 | Kai | H02J 7/0027 |
| 9,595,790 B1 | 3/2017 | Cao | |
| 9,601,861 B2 | 3/2017 | Kanamori | |
| 9,841,451 B2 | 12/2017 | Reid | |
| 10,227,014 B2 * | 3/2019 | Wu | B60L 3/04 |
| 10,644,462 B2 | 5/2020 | Shimizu | |
| 11,299,058 B2 * | 4/2022 | Enthaler | H02J 7/0045 |
| 2012/0206100 A1 | 8/2012 | Brown | |
| 2013/0278273 A1 | 10/2013 | Barlag | |
| 2017/0261039 A1 | 9/2017 | Cao | |

(Continued)

FOREIGN PATENT DOCUMENTS

JP           2021035080        * 1/2021

OTHER PUBLICATIONS

Patel R., Energy Storage in Electric Vehicles, Jun. 30, 2018.

*Primary Examiner* — Richard V Muralidar
(74) *Attorney, Agent, or Firm* — Caldwell Intellectual Property Law, LLC

(57) ABSTRACT

An electric aircraft charging connector, including a direct current pin and/or an alternating current pin. The connector including a ground pin, the ground pin providing a grounded connection. The connector also including a resistance sensor, the resistance sensor electrically connected to the direct current pin and/or the alternating current pin, and the ground pin, the resistance sensor configured to measure a resistance datum, the resistance datum including: a first resistance, the first resistance comprising a measurement of resistance between the direct current pin and the ground pin; and a second resistance, the second resistance comprising a measurement of resistance between the alternating current pin and the ground pin. The connector also including a controller, the controller configured to: receive the resistance datum from the resistance sensor; and compare the resistance datum to a threshold resistance datum.

20 Claims, 7 Drawing Sheets

(56) References Cited

U.S. PATENT DOCUMENTS

2019/0389324 A1    12/2019   Koolen
2021/0094427 A1*    4/2021   Galin ........................ H02J 4/00

* cited by examiner

SYSTEMS AND METHODS FOR AN ELECTRIC AIRCRAFT CHARGING CONNECTOR

FIELD OF THE INVENTION

The present invention generally relates to the field of charging systems for electric vehicles. In particular, the present invention is directed to systems and methods for an electric aircraft charging connector.

BACKGROUND

In electric vehicle charging systems there exists the danger that the charging system may develop a short circuit. A short circuit can damage or destroy expensive electric components. Additionally, a short circuit runs the risk of starting a fire, which could significantly harm the vehicle and place people in the surrounding area in danger. Existing solutions for monitoring an electric vehicle charging system for short circuits do not resolve this issue in a satisfactory manner.

SUMMARY OF THE DISCLOSURE

In an aspect, an electric aircraft charging connector, includes a direct current pin, an alternating current pin, a ground pin, the ground pin providing a grounded connection, a resistance sensor, the resistance sensor electrically connected to the direct current pin, the alternating current pin, and the ground pin, the resistance sensor configured to measure a resistance datum, the resistance datum including a first resistance, the first resistance including a measurement of resistance between the direct current pin and the ground pin, and a second resistance, the second resistance including a measurement of resistance between the alternating current pin and the ground pin and a controller, the controller configured to receive the resistance datum from the resistance sensor and compare the resistance datum to a threshold resistance datum In another aspect, A method of monitoring an electric aircraft charging connector, including: receiving a first resistance, the first resistance including a measurement of resistance between a direct current pin and a ground pin, receiving a second resistance, the second resistance including a measurement of resistance between an alternating current pin and a ground pin, comparing the first resistance to a threshold resistance datum, and disengaging a switch if the first resistance is less than the threshold resistance datum.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for charging an electric aircraft. In an embodiment, charging connector includes a resistance sensor monitoring the resistance between an AC pin and ground and/or a DC pin and ground.

Aspects of the present disclosure can be used to monitor an electric vehicle charging system for short circuits. Aspects of the present disclosure can also be used to disconnect the charging circuit when a short is detected. Other aspects of the present disclosure can be used to alert a user when a short circuit occurs. This is so, at least in part, because the measurements from the resistance sensor can be used to detect when a short circuit occurs.

Aspects of the present disclosure allow for a safer charging systems for electric aircraft as short circuits can cause damage to electrical component or even cause a fire. Exemplary embodiments illustrating aspects of the present disclosure are described below in the context of several specific examples.

Figure 1:
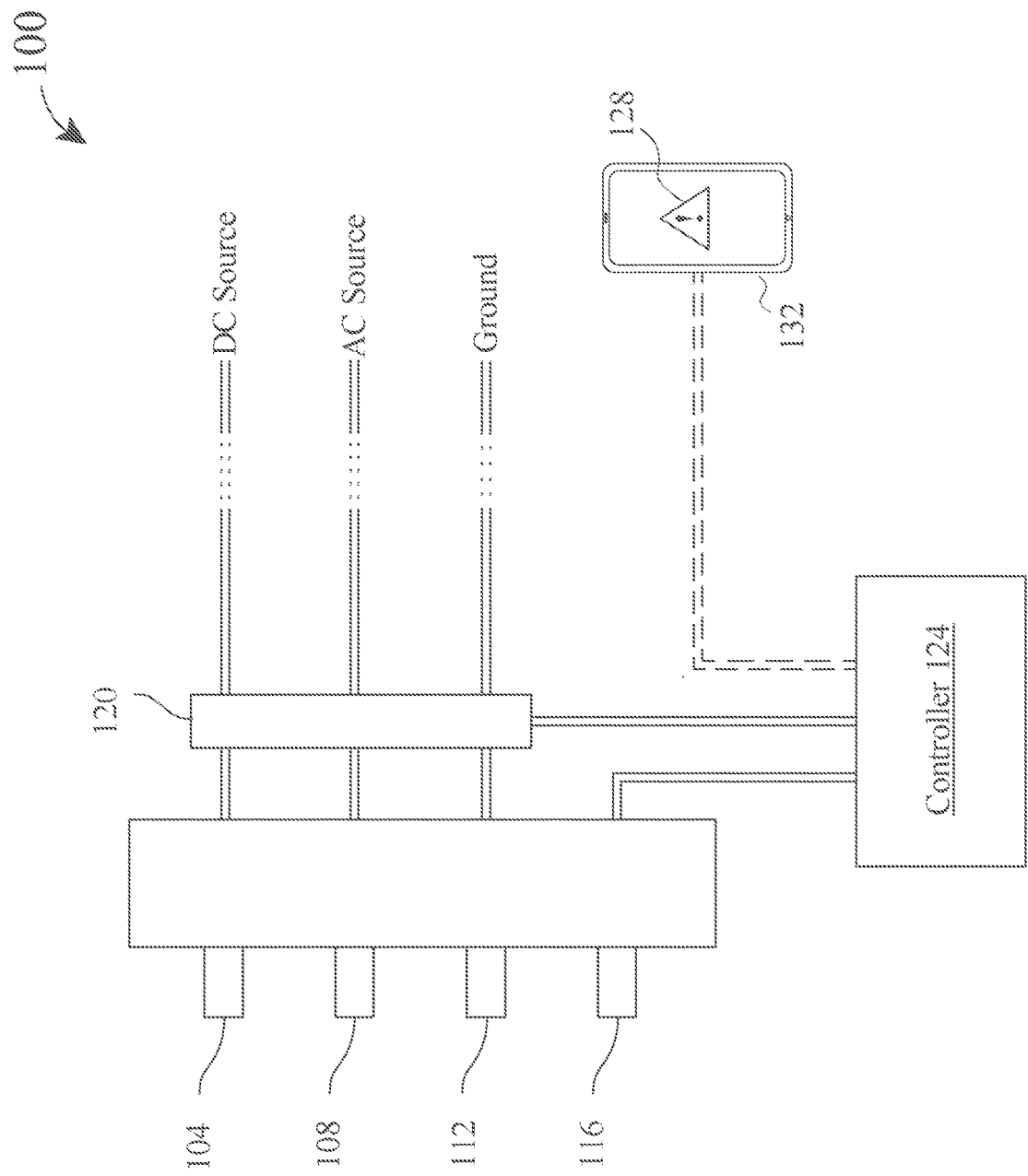
FIG. 1 is a block diagram of a charging connector.

FIG. 1 shows a depiction of an embodiment of charging connector 100. The charging connector 100 includes a ground pin 104 and at least a direct current (DC) pin 108 and/or an alternating current (AC) pin 112. In some embodiments, charging connector 100 may include both a DC pin 108 and an AC pin 112. In some embodiments, charging connector 100 may further include a proximity detection pin 116.

With continued reference to FIG. 1, for the purposes of this disclosure, a "pin" may be any type of electrical connector. An electrical connector is a device used to join electrical conductors to create a circuit. As a non-limiting example, in some embodiments, ground pin 104, DC pin 108, AC pin 112, and/or proximity detection pin 116 may be the male component of a pin and socket connector. In other embodiments, ground pin 104, DC pin 108, AC pin 112, and/or proximity detection pin 116 may be the female component of a pin and socket connector. As a further example of an embodiment, DC pin 108 may have a keying component. A keying component is a part of an electrical connector that prevents the electrical connector components from mating in an incorrect orientation. As a non-limiting example, this can be accomplished by making the male and female components of an electrical connector asymmetrical. Any or all of the ground pin 104, DC pin 108, AC pin 112, and proximity detection pin 116 may have a keying component. Additionally, in some embodiments, ground pin 104, DC pin 108, AC pin 112, and/or proximity detection pin 116 may include a locking mechanism. For instance, as a non-limiting example, any or all of ground pin 104, DC pin 108, AC pin 112, and proximity detection pin 116 may include a locking mechanism to lock the pins in place. Additionally, the locking mechanism may, for example, be triggered by a lever. In another embodiment, for example, the locking mechanism could be triggered by an electronic or radio signal. Ground pin 104, DC pin 108, AC pin 112, and proximity detection pin 116 may each be any type of the various types of electrical connectors disclosed above, or they could all be the same type of electrical connector. One of ordinary skill in the art, after reviewing the entirety of this disclosure, would understand that a wide variety of electrical connectors may be suitable for this application.

With continued reference to FIG. 1, DC pin 108 supplies DC power. "DC power," for the purposes of this disclosure refers to, a one-directional flow of charge. For example, in some embodiments, DC pin 108 may supply power with a constant current and voltage. As another example, in other embodiments, DC pin 108 may supply power with varying current and voltage, or varying currant constant voltage, or constant currant varying voltage. In another embodiment, when charging connector is charging certain types of batteries, DC pin 108 may support a varied charge pattern. This involves varying the voltage or currant supplied during the charging process in order to reduce or minimize battery degradation. Examples of DC power flow include half-wave rectified voltage, full-wave rectified voltage, voltage supplied from a battery or other DC switching power source, a DC converter such as a buck or boost converter, voltage supplied from a DC dynamo or other generator, voltage from photovoltaic panels, voltage output by fuel cells, or the like. AC pin 112 supplies AC power. For the purposes of this disclosure, "AC power" refers to electrical power provided with a bi-directional flow of charge, where the flow of charge is periodically reversed. AC pin 112 may supply AC power at a variety of frequencies. For example, in a non-limiting embodiment, AC pin 112 may supply AC power with a frequency of 50 Hz. In another non-limiting embodiment, AC pin 112 may supply AC power with a frequency of 60 Hz. One of ordinary skill in the art, upon reviewing the entirety of this disclosure, would realize that AC pin 112 may supply a wide variety of frequencies. AC power produces a waveform when it is plotted out on a current vs. time or voltage vs. time graph. In some embodiments, the waveform of the AC power supplied by AC pin 112 may be a sine wave. In other embodiments, the waveform of the AC power supplied by AC pin 112 may be a square wave. In some embodiments, the waveform of the AC power supplied by AC pin 112 may be a triangle wave. In yet other embodiments, the waveform of the AC power supplied by AC pin 112 may be a sawtooth wave. The AC power supplied by AC pin 112 may, in general have any waveform, so long as the wave form produces a bi-directional flow of charge. AC power may be provided without limitation, from alternating current generators, "mains" power provided over an AC power network from power plants, AC power output by AC voltage converters including transformer-based converters, and/or AC power output by inverters that convert DC power, as described above, into AC power. For the purposes of this disclosure, "supply," "supplies," "supplying," and the like, include both currently supplying and capable of supplying. For example, a live pin that "supplies" DC power need not be currently supplying DC power, it can also be capable of supplying DC power.

With continued reference to FIG. 1, ground pin 104 is an electronic connector that is connected to ground. For the purpose of this disclosure, "ground" is the reference point from which all voltages for a circuit are measured. "Ground" can include both a connection the earth, or a chassis ground, where all of the metallic parts in a device are electrically connected together. In some embodiments, "ground" can be a floating ground. Ground may alternatively or additionally refer to a "common" channel or "return" channel in some electronic systems. For instance, a chassis ground may be a floating ground when the potential is not equal to earth ground. In some embodiments, a negative pole in a DC circuit may be grounded. A "grounded connection," for the purposes of this disclosure, is an electrical connection to "ground." A circuit may be grounded in order to increase safety in the event that a fault develops, to absorb and reduce static charge, and the like. Speaking generally, a grounded connection allows electricity to pass through the grounded connection to ground instead of through, for example, a human that has come into contact with the circuit. Additionally, grounding a circuit helps to stabilize voltages within the circuit.

With continued reference to FIG. 1, ground pin 104, DC pin 108, and AC pin 112 are electrically connected to resistance sensor 120. In some embodiments, charging connector 100 may include a DC pin 108 or an AC pin 112, but not both; in this case, resistance sensor 120 may be connected to ground pin 104 and whichever of DC pin 108 and AC pin 112 is included in charging connector 100. Resistance sensor 120 may measure a first resistance and a second resistance. First resistance includes a measurement of the resistance between DC pin 108 and ground pin 104. Second resistance includes a measurement of the resistance between AC pin 112 and ground pin 104. Resistance sensor 120 may be a sensor that directly measures resistance, such as an ohmmeter. An ohmmeter may generally work by passing a small current through the section of circuit to which the ohmmeter is attached; the ohmmeter may then measure a voltage drop across the section of circuit and uses this to calculate the resistance. In some embodiments, resistance sensor 120 may be a sensor that can measure multiple different electrical properties such as a multimeter. In yet other embodiments, resistance sensor may measure resistance indirectly. For instance, as a non-limiting example, resistance sensor 120 may be an ammeter or a voltmeter. In this case, either controller 124 or resistance sensor 120 may convert the measured property into a resistance datum.

With continued reference to FIG. 1, resistance sensor 120 may be part of a sensor suite. Sensor suite may include a sensor or plurality thereof that may detect voltage, current, resistance, capacitance, temperature, or inductance; detection may be performed using any suitable component, set of components, and/or mechanism for direct or indirect measurement, including without limitation comparators, analog to digital converters, any form of voltmeter, or the like. Sensor suite may include digital sensors, analog sensors, or a combination thereof. Sensor suite may include digital-to-analog converters (DAC), analog-to-digital converters (ADC, A/D, A-to-D), a combination thereof, or other signal conditioning components used in transmission of a resistance datum over wired or wireless connection.

With continued reference to FIG. 1, Sensor suite may measure an electrical property at an instant, over a period of time, or periodically. Sensor suite may be configured to operate at any of these detection modes, switch between modes, or simultaneous measure in more than one mode.

With continued reference to FIG. 1, sensor suite may include thermocouples, thermistors, thermometers, passive infrared sensors, resistance temperature sensors (RTD's), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor suite, may be measured in Fahrenheit (° F.), Celsius (° C.), Kelvin (° K), or another scale alone or in combination. The temperature measured by sensors may comprise electrical signals which are transmitted to their appropriate destination through a wireless or wired connection.

With continued reference to FIG. 1, resistance sensor 120 may be electronically connected to a controller 124. In this embodiment, resistance sensor 120 may transmit the resistance datum to controller 124 using this electric connection. In another embodiment, resistance sensor 120 may wirelessly transmit the resistance datum to the controller 124. This can be accomplished, for example, using any suitable wireless communication technology, such as radio waves, Bluetooth, or WiFi. One of ordinary skill in the art, upon reviewing the entirety of this disclosure, would recognize that a variety of wireless communication technologies are suitable for this application.

With continued reference to FIG. 1, controller 124 receives the resistance datum from the resistance sensor. As mentioned above, this may occur via any suitable wired or wireless communication technology. Controller 124 is configured to compare the resistance datum to a threshold resistance datum. Threshold resistance datum may be manually set. Threshold resistance datum may include any limit of resistance that the resistance between DC pin 108 and ground pin 104 or the AC pin 112 and the ground pin 104 cannot fall below. In some embodiments, comparing the resistance datum to a threshold resistance datum may include verifying that the resistance datum does not fall below the threshold resistance datum.

With continued reference to FIG. 1, in some embodiments, controller 124 may be implemented using an analog circuit. For example, in some embodiments controller 124 may be implemented using an analog circuit using operational amplifiers, comparators, transistors, or the like. In some embodiments, controller 124 may be implemented using a digital circuit having one or more logic gates. In some embodiments, controller may be implemented using a combinational logic circuit, a synchronous logic circuit, an asynchronous logic circuit, or the like. In other embodiments, controller 124 may be implemented using an application specific integrated circuit (ASIC). In yet other embodiments, controller 124 may be implemented using a field programmable gate array (FPGA) and the like.

With continued reference to FIG. 1, in some embodiments, controller 124 may be a computing device, flight controller, processor, control circuit, or the like. With continued reference to FIG. 1, controller 124 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. controller 124 may include a single computing device operating independently, or may include two or more computing device operating in concert, in parallel, sequentially or the like; two or more computing devices may be included together in a single computing device or in two or more computing devices. controller 124 may interface or communicate with one or more additional devices as described below in further detail via a network interface device. Network interface device may be utilized for connecting controller 124 to one or more of a variety of networks, and one or more devices.

Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. controller 124 may include but is not limited to, for example, a computing device or cluster of computing devices in a first location and a second computing device or cluster of computing devices in a second location. controller 124 may include one or more computing devices dedicated to data storage, security, distribution of traffic for load balancing, and the like. controller 124 may distribute one or more computing tasks as described below across a plurality of computing devices of computing device, which may operate in parallel, in series, redundantly, or in any other manner used for distribution of tasks or memory between computing devices.

With continued reference to FIG. 1, controller 124 may be configured to perform any method, method step, or sequence of method steps in any embodiment described in this disclosure, in any order and with any degree of repetition. For instance, controller 124 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. controller 124 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, in some embodiments, charging connector 100 may include a proximity detection pin 116. Controller 124 may receive a current datum from the proximity detection pin 116. In some embodiments, the proximity detection pin 116 may be electrically connected to the controller 124 to transmit current datum. Proximity detection pin 116 has no current flowing through it when charging connector 100 is not connected to a plug (e.g. charging port 316). Once charging connector 100 is connected to a plug, then proximity detection pin 116 will have current flowing through it, allowing for the controller to detect, using this current flow, that the charging connector 100 is connected to a plug. In some embodiments, current datum may be the measurement of the current passing through proximity detection pin. In some embodiments proximity detection pin 116 may have a current sensor that generates the current datum. In other embodiments, proximity detection sensor may be electrically connected to controller and controller may include a current sensor.

With continued reference to FIG. 1, controller 124 may be configured to display a visual alert 128 to a display 132 when resistance datum falls below the threshold resistance datum. Display 132 may include any display known in the art. Display 132 may be disposed on a charging device (e.g. charger 304). In another embodiment, display 132 may be disposed on a mobile device such as a smartphone or tablet. In another embodiment, display 132 may be disposed on a computer device, the computer device, for instance, located on board an electric aircraft or located remotely. In another embodiment, display 132 may be a flight display known in the art to be disposed in at least a portion of a cockpit of an electric aircraft. Visual alert 128 may comprise text. In an embodiment, for example, visual alert 128 may include a textual warning that an electrical short has been detected. A wide variety of possible textual warnings are possible. In another embodiment, visual alert 128 may include a warning sign such as a flashing symbol or other icon designed to alert the user to the problem. In some embodiments, controller 124 may be configured to send an audio alert. Sending an audio alert may include sending a signal to a speaker, or sending a signal to another device to trigger the audio alert. In some embodiments, there may be a speaker electrically connected to controller 124. In other embodiments, the speaker may be remote. As a non-limiting example, the speaker may be disposed on a charging device (e.g. charger 304). As another non-limiting example, the speaker may be disposed on a mobile device such as a smartphone or tablet. In some embodiments, both visual alert 128 and the audio alert may be transmitted via either a wired or wireless connection.

Figure 2:
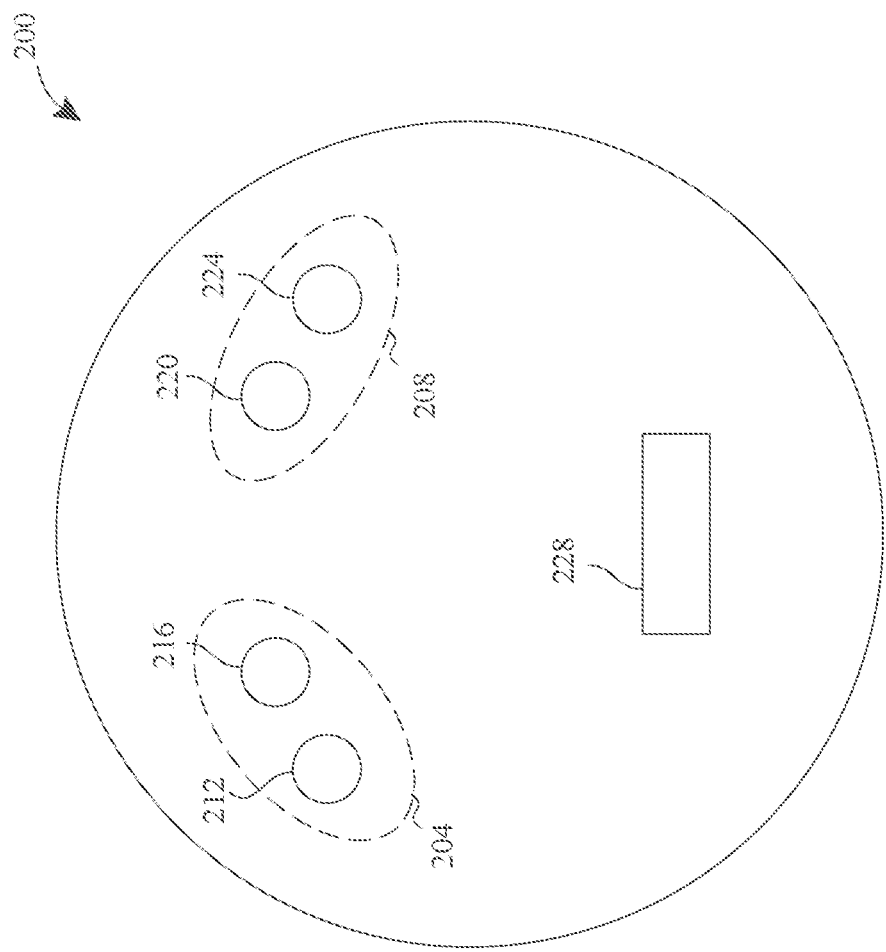
FIG. 2 is a diagram of the face of a charging connector.

FIG. 2 is a depiction of the face of an embodiment of charging connector 200. Charging connector 200 may include AC pins 204. AC pins 204 carry AC power and may be consistent with any AC pin or pins previously disclosed in this disclosure. Charging connector 200 may include DC pins 208. DC pins 208 carry DC power and may be consistent with any DC pin or pins previously disclosed in this disclosure. AC pins 204 pins may include an AC live pin 212 and an AC return pin 216. AC live pin 212 may supply AC power to a load. AC return pin 216 may provide a return path for AC power from the load. DC pins 208 may include a DC live pin 220 and a DC return pin 224. DC live pin 220 may supply DC power to a load. DC return pin 224 may provide a return path for DC power from the load. Charging connector 200 may include a ground pin 228. Ground pin 228 is an electronic connector that is connected to ground. FIG. 2 is just one of many possible configurations for charging connector 200. For example, the locations of AC pins 204, DC pins 208, and ground pin 228 can be anywhere on the face of charging connector 200. The "face" of charging connector 200 is the portion of charging connector 200 adapted to mate with a corresponding charging port in an electric vehicle. Additionally, in some embodiments, there may be any number of live pins (e.g. AC live pin 212) and return pins (e.g. AC return pin 216). One of ordinary skill in the art, after viewing the entirety of this disclosure, would realize that there are a variety of possible configurations for charging connector 200.

Figure 3:
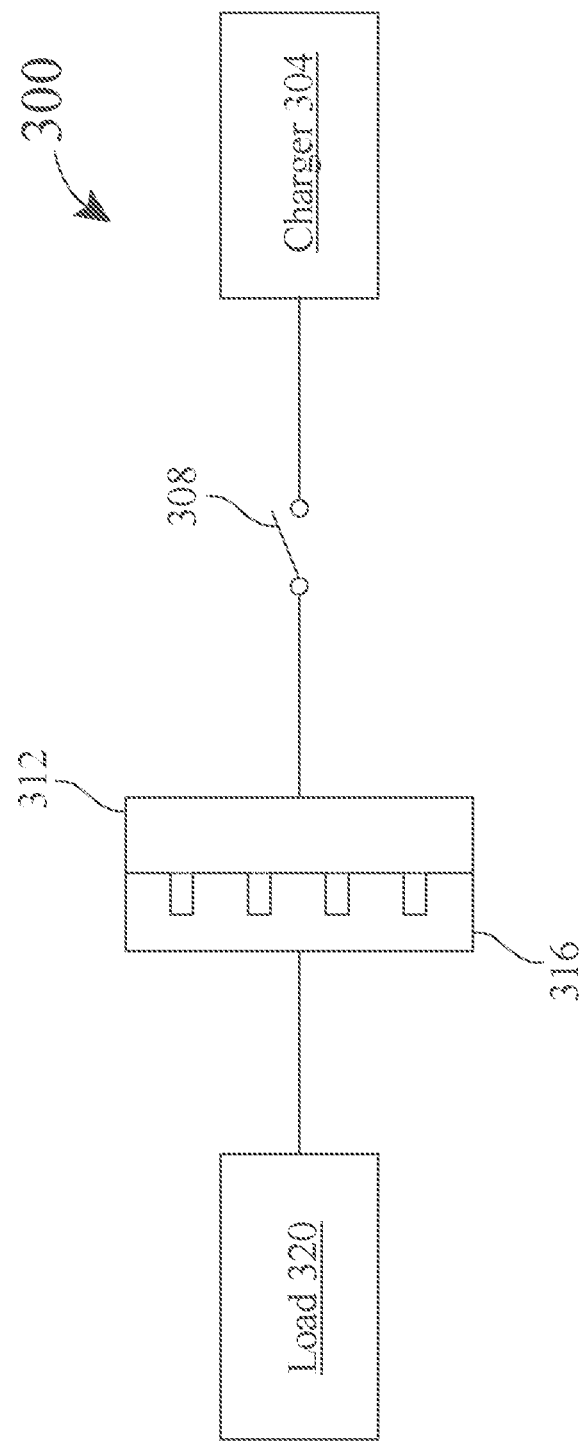
FIG. 3 is a diagram of a charging system.

FIG. 3 shows a block diagram of an embodiment of charging system 300. Charging system 300 includes charger 304, switch 308, charging connector 312, charging port 316, and load 320. Charger 304 can include an energy storage device or plurality of energy storage devices. As used in this disclosure, a "charger" is an electrical system and/or circuit that increases electrical energy in an energy store, for example a battery. In some embodiments, the energy storage device may be a battery. Charger 304 may provide AC and/or DC power to charging connector 312. In some embodiments, charger 304 may include the ability to provide an alternating current to direct current converter configured to convert an electrical charging current from an alternating current. As used in this disclosure, an "analog current to direct current converter" is an electrical component that is configured to convert analog current to digital current. An analog current to direct current (AC-DC) converter may include an analog current to direct current power supply and/or transformer. In some embodiments, charger 304 may have a connection to grid power component. Grid power component may be connected to an external electrical power grid. In some embodiments, grid power component may be configured to slowly charge one or more batteries in order to reduce strain on nearby electrical power grids. In one embodiment, grid power component may have an AC grid current of at least 450 amps. In some embodiments, grid power component may have an AC grid current of more or less than 450 amps. In one embodiment, grid power component may have an AC voltage connection of 480 Vac. In other embodiments, grid power component may have an AC voltage connection of above or below 480 Vac. Charger 304 may be consistent with the charger disclosed in U.S. application Ser. No. 17/477,987 filed on Sep. 17, 2021, titled "Systems and Methods for Adaptive Electric Vehicle reference. Additionally, charger 304 may be consistent with the charger disclosed in U.S. application Ser. No. 17/515,448 filed on Oct. 30, 2021, titled "Systems and Methods for an Immediate Shutdown of an Electric Vehicle Charger," the entirety of which is hereby incorporated by reference.

With continued reference to FIG. 3, Charger 304 may be electronically connected to switch 308. Switch may have an engaged state and a disengaged state. In the engaged state, switch 308 electronically connects charger 304 to charging connector 312. When charging connector 312 is connected to charging port 316, switch 308 may be in its engaged state such that charger 304 is electrically connected to load 320. Charging connector 312 may contain a controller. For example, charging connector 312 may include a controller consistent with controller 124 in FIG. 1. Charging connector 312 may be consistent with any other charging connector disclosed in this disclosure. When the controller of charging connector 312 detects that the resistance datum is less than the resistance threshold datum, controller may change switch 308 to its disengaged state. When switch 308 is in its disengaged state, charger 304 is not electrically connected to load 320. In some embodiments, switch 308 may be engaged in response to a command. In one embodiment, the command can be initiated automatically by the controller or, in an alternative embodiment, the command may be initiated manually by a user such as by pushing a button or selecting an option on a display. In certain embodiments, switch may be engaged when the current datum received from the proximity detection pin is measured to be zero.

With continued reference to FIG. 3, switch 308 may be any device configured to allow current flow in one state and disallow current flow in another state. In some cases, this can be accomplished by the physical disconnection of a circuit. As a non-limiting example, switch 308 may be a mechanical switch. As another example, switch 308 may be a relay. A relay is an electrically and/or electromechanically operated switch that can receive control signals. A relay can be engaged or disengaged by the control signals. A relay need not have any moving parts and can be solid state. As another non-limiting example, switch 308 may be a circuit breaker.

With continued reference to FIG. 3, in certain embodiments, although switch 308 is depicted in FIG. 3 as being located between charging connector 312 and charger 304 it need not be located there. As a non-limiting example, in some embodiments, switch 308 may be located between load 320 and charging port 316. This embodiment may be particularly advantageous when controller is a flight controller as it allows switch to be easily electrically connected to the flight controller.

With continued reference to FIG. 3, charging connector 312 may be electrically connected to charging port 316. Charging port 316 may be disposed on the device to be charged. Charging port 316 may be electrically connected to load 320. Load 320 may be an energy storage device such as a battery or a plurality of batteries. As a non-limiting example, in one embodiment, load 320 may be an electric aircraft. Load 320 may be located in an electric vehicle such as, for example, an electric airplane.

Figure 4:
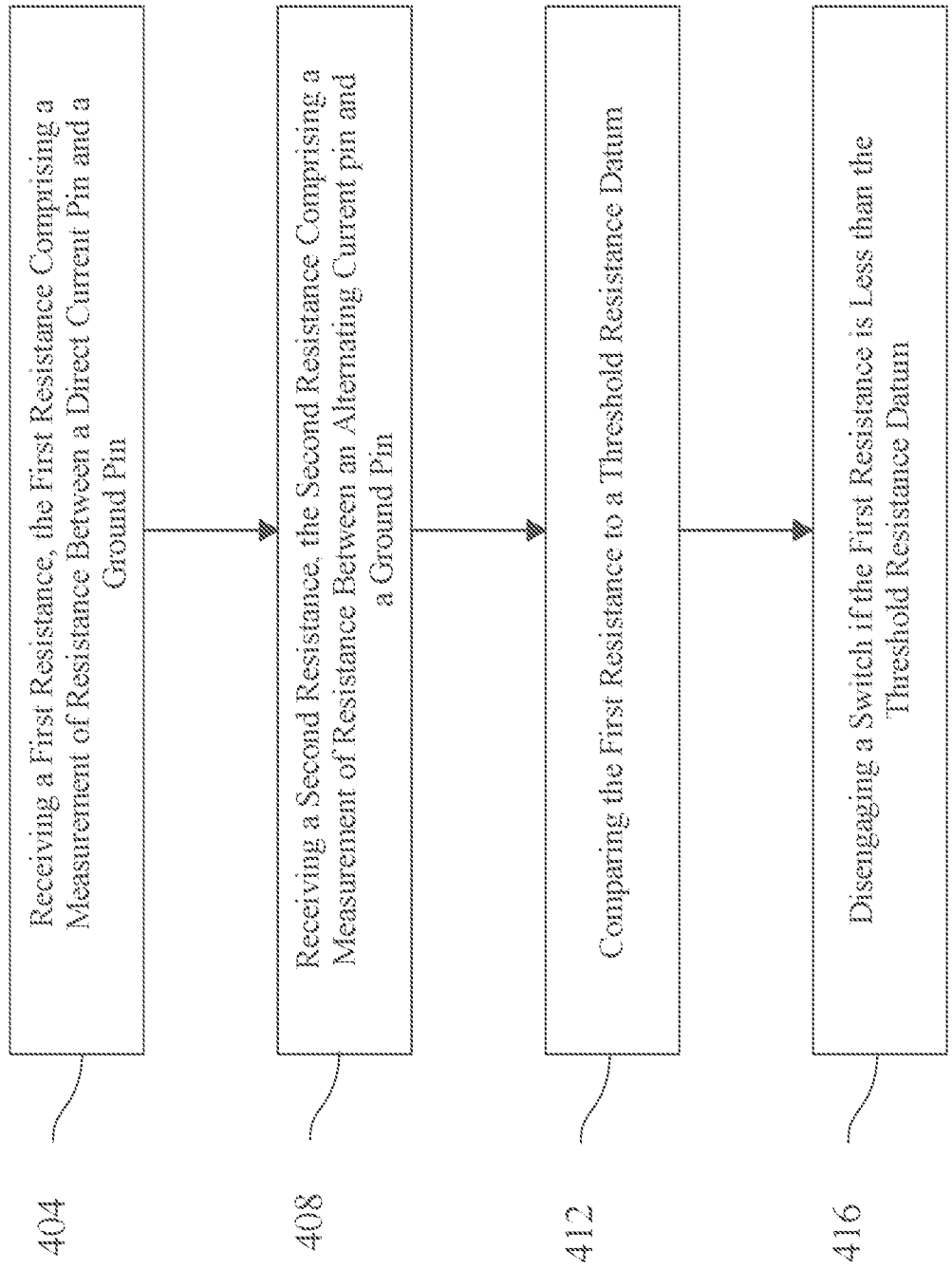
FIG. 4 illustrates a flow chart of a method of monitoring an electric aircraft charging connector.

FIG. 4 is a flow chart of method of monitoring an electric aircraft charging connector %%00. Method 400 includes a step 404 of receiving a first resistance, where the first resistance includes a measurement of the resistance between a direct current pin and a ground pin. First resistance may be consistent with any first resistance disclosed in this disclosure. Direct current pin may be consistent with any direct current pin disclosed in this disclosure. Ground pin may be consistent with any ground pin disclosed in this disclosure. In some embodiments, direct current pin and ground pin may be part of a charging connector. Charging connector may be consistent with any charging connector disclosed in this disclosure.

With continued reference to FIG. 4, method 400 includes a step 408 of receiving a second resistance, where the second resistance includes a measurement of the resistance between an alternating current pin and a ground pin. Second resistance may be consistent with any second resistance disclosed in this disclosure. Alternating current pin may be consistent with any alternating current pin disclosed in this disclosure. Ground pin may be consistent with any ground pin disclosed in this disclosure.

With continued reference to FIG. 4, method 400 includes a step 412 of comparing the first resistance to a threshold resistance datum. The threshold resistance datum may be consistent with any threshold resistance datum disclosed in this disclosure.

With continued reference to FIG. 4, method 400 includes a step 416 of disengaging a switch if the first resistance is less than the threshold resistance datum. The switch may be consistent with any switch disclosed as part of this disclosure. In this embodiment, "disengaging" the switch means that the switch cuts off power to a load. The threshold resistance datum may be consistent with any threshold resistance datum disclosed in this disclosure.

With continued reference to FIG. 4, method 400, in some non-limiting embodiments, may include a step of comparing the second resistance to a threshold resistance datum. In some non-limiting embodiments, method 400 may include a step of disengaging the switch if the second resistance is less than the threshold resistance datum.

With continued reference to FIG. 4, method 400, in some non-limiting embodiments, may include a step of engaging the switch in response to a command initiated by a user. In this embodiment, "engaging" the switch means electrically connecting power to a load. The command may be consistent with any command disclosed in this disclosure. The user can be any user of the charging device.

With continued reference to FIG. 4, method 400, in some non-limiting embodiments, may include a step of receiving a current datum from a proximity detection pin. Current datum may be consistent with any current datum disclosed in this disclosure. Proximity detection pin may be consistent with any current datum disclosed in this disclosure. In some embodiments, proximity detection pin may be part of a charging connector. In some non-limiting embodiments, method 400 also includes a step of engaging the switch when the current datum is zero.

With continued reference to FIG. 4, method 400, in some non-limiting embodiments, may include a step of displaying a visual alert on a display. The visual alert may be consistent with any other visual alert disclosed in this disclosure. The display may be consistent with any other display disclosed in this disclosure.

With continued reference to FIG. 4, method 400, in some non-limiting embodiments, may include a step of sending an audio alert. Sending an audio alert may be consistent with any other recitation of sending an audio alert in this disclosure.

Figure 5:
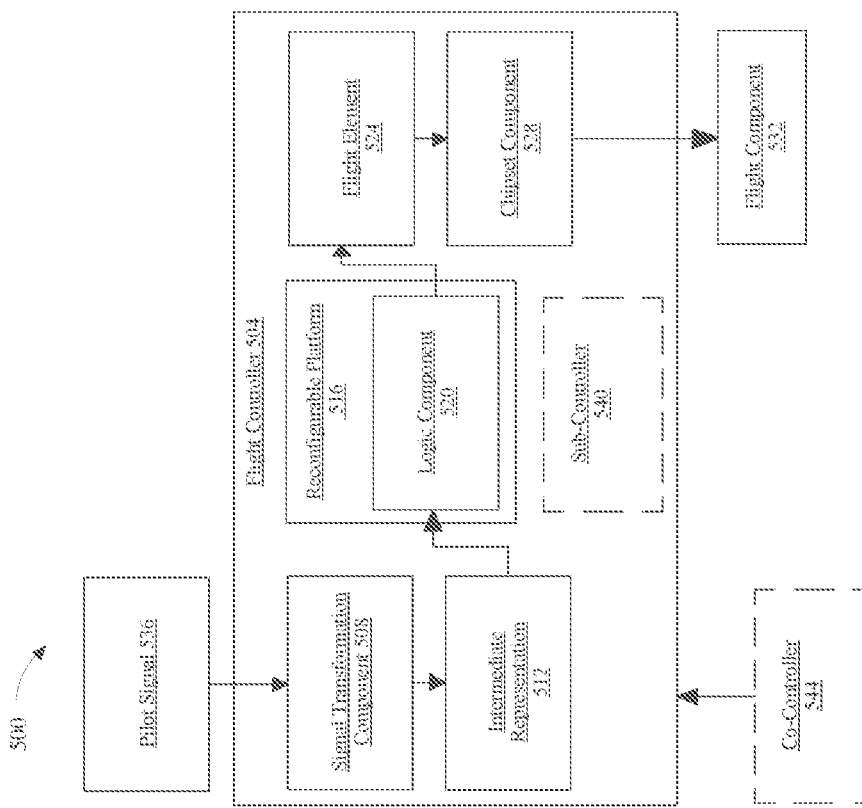
FIG. 5 is a block diagram of an exemplary flight controller.

Now referring to FIG. 5, an exemplary embodiment 500 of a flight controller 504 is illustrated. As used in this disclosure a "flight controller" is a computing device of a plurality of computing devices dedicated to data storage, security, distribution of traffic for load balancing, and flight instruction. Flight controller 504 may include and/or communicate with any computing device as described in this disclosure, including without limitation a microcontroller, microprocessor, digital signal processor (DSP) and/or system on a chip (SoC) as described in this disclosure. Further, flight controller 504 may include a single computing device operating independently, or may include two or more computing device operating in concert, in parallel, sequentially or the like; two or more computing devices may be included together in a single computing device or in two or more computing devices. In embodiments, flight controller 504 may be installed in an aircraft, may control the aircraft remotely, and/or may include an element installed in the aircraft and a remote element in communication therewith.

In an embodiment, and still referring to FIG. 5, flight controller 504 may include a signal transformation component 508. As used in this disclosure a "signal transformation component" is a component that transforms and/or converts a first signal to a second signal, wherein a signal may include one or more digital and/or analog signals. For example, and without limitation, signal transformation component 508 may be configured to perform one or more operations such as preprocessing, lexical analysis, parsing, semantic analysis, and the like thereof. In an embodiment, and without limitation, signal transformation component 508 may include one or more analog-to-digital convertors that transform a first signal of an analog signal to a second signal of a digital signal. For example, and without limitation, an analog-to-digital converter may convert an analog input signal to a 10-bit binary digital representation of that signal. In another embodiment, signal transformation component 508 may include transforming one or more low-level languages such as, but not limited to, machine languages and/or assembly languages. For example, and without limitation, signal transformation component 508 may include transforming a binary language signal to an assembly language signal. In an embodiment, and without limitation, signal transformation component 508 may include transforming one or more high-level languages and/or formal languages such as but not limited to alphabets, strings, and/or languages. For example, and without limitation, high-level languages may include one or more system languages, scripting languages, domain-specific languages, visual languages, esoteric languages, and the like thereof. As a further non-limiting example, high-level languages may include one or more algebraic formula languages, business data languages, string and list languages, object-oriented languages, and the like thereof.

Still referring to FIG. 5, signal transformation component 508 may be configured to optimize an intermediate representation 512. As used in this disclosure an "intermediate representation" is a data structure and/or code that represents the input signal. Signal transformation component 508 may optimize intermediate representation as a function of a data-flow analysis, dependence analysis, alias analysis, pointer analysis, escape analysis, and the like thereof. In an embodiment, and without limitation, signal transformation component 508 may optimize intermediate representation 512 as a function of one or more inline expansions, dead code eliminations, constant propagation, loop transformations, and/or automatic parallelization functions. In another embodiment, signal transformation component 508 may optimize intermediate representation as a function of a machine dependent optimization such as a peephole optimization, wherein a peephole optimization may rewrite short sequences of code into more efficient sequences of code. Signal transformation component 508 may optimize intermediate representation to generate an output language, wherein an "output language," as used herein, is the native machine language of flight controller 504. For example, and without limitation, native machine language may include one or more binary and/or numerical languages.

In an embodiment, and without limitation, signal transformation component 508 may include transform one or more inputs and outputs as a function of an error correction code. An error correction code, also known as error correcting code (ECC), is an encoding of a message or lot of data using redundant information, permitting recovery of corrupted data. An ECC may include a block code, in which information is encoded on fixed-size packets and/or blocks of data elements such as symbols of predetermined size, bits, or the like. Reed-Solomon coding, in which message symbols within a symbol set having q symbols are encoded as coefficients of a polynomial of degree less than or equal to a natural number k, over a finite field F with q elements; strings so encoded have a minimum hamming distance of k+1, and permit correction of (q−k−1)/2 erroneous symbols. Block code may alternatively or additionally be implemented using Golay coding, also known as binary Golay coding, Bose-Chaudhuri, Hocquenghuem (BCH) coding, multidimensional parity-check coding, and/or Hamming codes. An ECC may alternatively or additionally be based on a convolutional code.

In an embodiment, and still referring to FIG. 5, flight controller 504 may include a reconfigurable hardware platform 516. A "reconfigurable hardware platform," as used herein, is a component and/or unit of hardware that may be reprogrammed, such that, for instance, a data path between elements such as logic gates or other digital circuit elements may be modified to change an algorithm, state, logical sequence, or the like of the component and/or unit. This may be accomplished with such flexible high-speed computing fabrics as field-programmable gate arrays (FPGAs), which may include a grid of interconnected logic gates, connections between which may be severed and/or restored to program in modified logic. Reconfigurable hardware platform 516 may be reconfigured to enact any algorithm and/or algorithm selection process received from another computing device and/or created using machine-learning processes.

Still referring to FIG. 5, reconfigurable hardware platform 516 may include a logic component 520. As used in this disclosure a "logic component" is a component that executes instructions on output language. For example, and without limitation, logic component may perform basic arithmetic, logic, controlling, input/output operations, and the like thereof. Logic component 520 may include any suitable processor, such as without limitation a component incorporating logical circuitry for performing arithmetic and logical operations, such as an arithmetic and logic unit (ALU), which may be regulated with a state machine and directed by operational inputs from memory and/or sensors; logic component 520 may be organized according to Von Neumann and/or Harvard architecture as a non-limiting example. Logic component 520 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC). In an embodiment, logic component 520 may include one or more integrated circuit microprocessors, which may contain one or more central processing units, central processors, and/or main processors, on a single metal-oxide-semiconductor chip. Logic component 520 may be configured to execute a sequence of stored instructions to be performed on the output language and/or intermediate representation 512. Logic component 520 may be configured to fetch and/or retrieve the instruction from a memory cache, wherein a "memory cache," as used in this disclosure, is a stored instruction set on flight controller 504. Logic component 520 may be configured to decode the instruction retrieved from the memory cache to opcodes and/or operands. Logic component 520 may be configured to execute the instruction on intermediate representation 512 and/or output language. For example, and without limitation, logic component 520 may be configured to execute an addition operation on intermediate representation 512 and/or output language.

In an embodiment, and without limitation, logic component 520 may be configured to calculate a flight element 524. As used in this disclosure a "flight element" is an element of datum denoting a relative status of aircraft. For example, and without limitation, flight element 524 may denote one or more torques, thrusts, airspeed velocities, forces, altitudes, groundspeed velocities, directions during flight, directions facing, forces, orientations, and the like thereof. For example, and without limitation, flight element 524 may denote that aircraft is cruising at an altitude and/or with a sufficient magnitude of forward thrust. As a further non-limiting example, flight status may denote that is building thrust and/or groundspeed velocity in preparation for a takeoff. As a further non-limiting example, flight element 524 may denote that aircraft is following a flight path accurately and/or sufficiently.

Still referring to FIG. 5, flight controller 504 may include a chipset component 528. As used in this disclosure a "chipset component" is a component that manages data flow. In an embodiment, and without limitation, chipset component 528 may include a northbridge data flow path, wherein the northbridge dataflow path may manage data flow from logic component 520 to a high-speed device and/or component, such as a RAM, graphics controller, and the like thereof. In another embodiment, and without limitation, chipset component 528 may include a southbridge data flow path, wherein the southbridge dataflow path may manage data flow from logic component 520 to lower-speed peripheral buses, such as a peripheral component interconnect (PCI), industry standard architecture (ICA), and the like thereof. In an embodiment, and without limitation, southbridge data flow path may include managing data flow between peripheral connections such as ethernet, USB, audio devices, and the like thereof. Additionally or alternatively, chipset component 528 may manage data flow between logic component 520, memory cache, and a flight component 532. As used in this disclosure a "flight component" is a portion of an aircraft that can be moved or adjusted to affect one or more flight elements. For example, flight component 532 may include a component used to affect the aircrafts' roll and pitch which may comprise one or more ailerons. As a further example, flight component 532 may include a rudder to control yaw of an aircraft. In an embodiment, chipset component 528 may be configured to communicate with a plurality of flight components as a function of flight element 524. For example, and without limitation, chipset component 528 may transmit to an aircraft rotor to reduce torque of a first lift propulsor and increase the forward thrust produced by a pusher component to perform a flight maneuver.

In an embodiment, and still referring to FIG. 5, flight controller 504 may be configured generate an autonomous function. As used in this disclosure an "autonomous function" is a mode and/or function of flight controller 504 that controls aircraft automatically. For example, and without limitation, autonomous function may perform one or more aircraft maneuvers, take offs, landings, altitude adjustments, flight leveling adjustments, turns, climbs, and/or descents. As a further non-limiting example, autonomous function may adjust one or more airspeed velocities, thrusts, torques, and/or groundspeed velocities. As a further non-limiting example, autonomous function may perform one or more flight path corrections and/or flight path modifications as a function of flight element 524. In an embodiment, autonomous function may include one or more modes of autonomy such as, but not limited to, autonomous mode, semi-autonomous mode, and/or non-autonomous mode. As used in this disclosure "autonomous mode" is a mode that automatically adjusts and/or controls aircraft and/or the maneuvers of aircraft in its entirety. For example, autonomous mode may denote that flight controller 504 will adjust the aircraft. As used in this disclosure a "semi-autonomous mode" is a mode that automatically adjusts and/or controls a portion and/or section of aircraft. For example, and without limitation, semi-autonomous mode may denote that a pilot will control the propulsors, wherein flight controller 504 will control the ailerons and/or rudders. As used in this disclosure "non-autonomous mode" is a mode that denotes a pilot will control aircraft and/or maneuvers of aircraft in its entirety.

In an embodiment, and still referring to FIG. 5, flight controller 504 may generate autonomous function as a function of an autonomous machine-learning model. As used in this disclosure an "autonomous machine-learning model" is a machine-learning model to produce an autonomous function output given flight element 524 and a pilot signal 536 as inputs; this is in contrast to a non-machine learning software program where the commands to be executed are determined in advance by a user and written in a programming language. As used in this disclosure a "pilot signal" is an element of datum representing one or more functions a pilot is controlling and/or adjusting. For example, pilot signal 536 may denote that a pilot is controlling and/or maneuvering ailerons, wherein the pilot is not in control of the rudders and/or propulsors. In an embodiment, pilot signal 536 may include an implicit signal and/or an explicit signal. For example, and without limitation, pilot signal 536 may include an explicit signal, wherein the pilot explicitly states there is a lack of control and/or desire for autonomous function. As a further non-limiting example, pilot signal 536 may include an explicit signal directing flight controller 504 to control and/or maintain a portion of aircraft, a portion of the flight plan, the entire aircraft, and/or the entire flight plan. As a further non-limiting example, pilot signal 536 may include an implicit signal, wherein flight controller 504 detects a lack of control such as by a malfunction, torque alteration, flight path deviation, and the like thereof. In an embodiment, and without limitation, pilot signal 536 may include one or more explicit signals to reduce torque, and/or one or more implicit signals that torque may be reduced due to reduction of airspeed velocity. In an embodiment, and without limitation, pilot signal 536 may include one or more local and/or global signals. For example, and without limitation, pilot signal 536 may include a local signal that is transmitted by a pilot and/or crew member. As a further non-limiting example, pilot signal 536 may include a global signal that is transmitted by air traffic control and/or one or more remote users that are in communication with the pilot of aircraft. In an embodiment, pilot signal 536 may be received as a function of a tri-state bus and/or multiplexor that denotes an explicit pilot signal should be transmitted prior to any implicit or global pilot signal.

Still referring to FIG. 5, autonomous machine-learning model may include one or more autonomous machine-learning processes such as supervised, unsupervised, or reinforcement machine-learning processes that flight controller 504 and/or a remote device may or may not use in the generation of autonomous function. As used in this disclosure "remote device" is an external device to flight controller 504. Additionally or alternatively, autonomous machine-learning model may include one or more autonomous machine-learning processes that a field-programmable gate array (FPGA) may or may not use in the generation of autonomous function. Autonomous machine-learning process may include, without limitation machine learning processes such as simple linear regression, multiple linear regression, polynomial regression, support vector regression, ridge regression, lasso regression, elasticnet regression, decision tree regression, random forest regression, logistic regression, logistic classification, K-nearest neighbors, support vector machines, kernel support vector machines, naïve bayes, decision tree classification, random forest classification, K-means clustering, hierarchical clustering, dimensionality reduction, principal component analysis, linear discriminant analysis, kernel principal component analysis, Q-learning, State Action Reward State Action (SARSA), Deep-Q network, Markov decision processes, Deep Deterministic Policy Gradient (DDPG), or the like thereof.

In an embodiment, and still referring to FIG. 5, autonomous machine learning model may be trained as a function of autonomous training data, wherein autonomous training data may correlate a flight element, pilot signal, and/or simulation data to an autonomous function. For example, and without limitation, a flight element of an airspeed velocity, a pilot signal of limited and/or no control of propulsors, and a simulation data of required airspeed velocity to reach the destination may result in an autonomous function that includes a semi-autonomous mode to increase thrust of the propulsors. Autonomous training data may be received as a function of user-entered valuations of flight elements, pilot signals, simulation data, and/or autonomous functions. Flight controller 504 may receive autonomous training data by receiving correlations of flight element, pilot signal, and/or simulation data to an autonomous function that were previously received and/or determined during a previous iteration of generation of autonomous function. Autonomous training data may be received by one or more remote devices and/or FPGAs that at least correlate a flight element, pilot signal, and/or simulation data to an autonomous function. Autonomous training data may be received in the form of one or more user-entered correlations of a flight element, pilot signal, and/or simulation data to an autonomous function.

Still referring to FIG. 5, flight controller 504 may receive autonomous machine-learning model from a remote device and/or FPGA that utilizes one or more autonomous machine learning processes, wherein a remote device and an FPGA is described above in detail. For example, and without limitation, a remote device may include a computing device, external device, processor, FPGA, microprocessor and the like thereof. Remote device and/or FPGA may perform the autonomous machine-learning process using autonomous training data to generate autonomous function and transmit the output to flight controller 504. Remote device and/or FPGA may transmit a signal, bit, datum, or parameter to flight controller 504 that at least relates to autonomous function. Additionally or alternatively, the remote device and/or FPGA may provide an updated machine-learning model. For example, and without limitation, an updated machine-learning model may be comprised of a firmware update, a software update, an autonomous machine-learning process correction, and the like thereof. As a non-limiting example a software update may incorporate a new simulation data that relates to a modified flight element. Additionally or alternatively, the updated machine learning model may be transmitted to the remote device and/or FPGA, wherein the remote device and/or FPGA may replace the autonomous machine-learning model with the updated machine-learning model and generate the autonomous function as a function of the flight element, pilot signal, and/or simulation data using the updated machine-learning model. The updated machine-learning model may be transmitted by the remote device and/or FPGA and received by flight controller 504 as a software update, firmware update, or corrected autonomous machine-learning model. For example, and without limitation autonomous machine learning model may utilize a neural net machine-learning process, wherein the updated machine-learning model may incorporate a gradient boosting machine-learning process.

Still referring to FIG. 5, flight controller 504 may include, be included in, and/or communicate with a mobile device such as a mobile telephone or smartphone. Further, flight controller may communicate with one or more additional devices as described below in further detail via a network interface device. The network interface device may be utilized for commutatively connecting a flight controller to one or more of a variety of networks, and one or more devices. Examples of a network interface device include, but are not limited to, a network interface card (e.g., a mobile network interface card, a LAN card), a modem, and any combination thereof. Examples of a network include, but not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. The network may include any network topology and can may employ a wired and/or a wireless mode of communication.

In an embodiment, and still referring to FIG. 5, flight controller 504 may include, but is not limited to, for example, a cluster of flight controllers in a first location and a second flight controller or cluster of flight controllers in a second location. Flight controller 504 may include one or more flight controllers dedicated to data storage, security, distribution of traffic for load balancing, and the like. Flight controller 504 may be configured to distribute one or more computing tasks as described below across a plurality of flight controllers, which may operate in parallel, in series, redundantly, or in any other manner used for distribution of tasks or memory between computing devices. For example, and without limitation, flight controller 504 may implement a control algorithm to distribute and/or command the plurality of flight controllers. As used in this disclosure a "control algorithm" is a finite sequence of well-defined computer implementable instructions that may determine the flight component of the plurality of flight components to be adjusted. For example, and without limitation, control algorithm may include one or more algorithms that reduce and/or prevent aviation asymmetry. As a further non-limiting example, control algorithms may include one or more models generated as a function of a software including, but not limited to Simulink by MathWorks, Natick, Mass., USA. In an embodiment, and without limitation, control algorithm may be configured to generate an auto-code, wherein an "auto-code," is used herein, is a code and/or algorithm that is generated as a function of the one or more models and/or software's. In another embodiment, control algorithm may be configured to produce a segmented control algorithm. As used in this disclosure a "segmented control algorithm" is control algorithm that has been separated and/or parsed into discrete sections. For example, and without limitation, segmented control algorithm may parse control algorithm into two or more segments, wherein each segment of control algorithm may be performed by one or more flight controllers operating on distinct flight components.

In an embodiment, and still referring to FIG. 5, control algorithm may be configured to determine a segmentation boundary as a function of segmented control algorithm. As used in this disclosure a "segmentation boundary" is a limit and/or delineation associated with the segments of the segmented control algorithm. For example, and without limitation, segmentation boundary may denote that a segment in the control algorithm has a first starting section and/or a first ending section. As a further non-limiting example, segmentation boundary may include one or more boundaries associated with an ability of flight component 532. In an embodiment, control algorithm may be configured to create an optimized signal communication as a function of segmentation boundary. For example, and without limitation, optimized signal communication may include identifying the discrete timing required to transmit and/or receive the one or more segmentation boundaries. In an embodiment, and without limitation, creating optimized signal communication further comprises separating a plurality of signal codes across the plurality of flight controllers.

For example, and without limitation the plurality of flight controllers may include one or more formal networks, wherein formal networks transmit data along an authority chain and/or are limited to task-related communications. As a further non-limiting example, communication network may include informal networks, wherein informal networks transmit data in any direction. In an embodiment, and without limitation, the plurality of flight controllers may include a chain path, wherein a "chain path," as used herein, is a linear communication path comprising a hierarchy that data may flow through. In an embodiment, and without limitation, the plurality of flight controllers may include an all-channel path, wherein an "all-channel path," as used herein, is a communication path that is not restricted to a particular direction. For example, and without limitation, data may be transmitted upward, downward, laterally, and the like thereof. In an embodiment, and without limitation, the plurality of flight controllers may include one or more neural networks that assign a weighted value to a transmitted datum. For example, and without limitation, a weighted value may be assigned as a function of one or more signals denoting that a flight component is malfunctioning and/or in a failure state.

Still referring to FIG. 5, the plurality of flight controllers may include a master bus controller. As used in this disclosure a "master bus controller" is one or more devices and/or components that are connected to a bus to initiate a direct memory access transaction, wherein a bus is one or more terminals in a bus architecture. Master bus controller may communicate using synchronous and/or asynchronous bus control protocols. In an embodiment, master bus controller may include flight controller 504. In another embodiment, master bus controller may include one or more universal asynchronous receiver-transmitters (UART). For example, and without limitation, master bus controller may include one or more bus architectures that allow a bus to initiate a direct memory access transaction from one or more buses in the bus architectures. As a further non-limiting example, master bus controller may include one or more peripheral devices and/or components to communicate with another peripheral device and/or component and/or the master bus controller. In an embodiment, master bus controller may be configured to perform bus arbitration. As used in this disclosure "bus arbitration" is method and/or scheme to prevent multiple buses from attempting to communicate with and/or connect to master bus controller. For example and without limitation, bus arbitration may include one or more schemes such as a small computer interface system, wherein a small computer interface system is a set of standards for physical connecting and transferring data between peripheral devices and master bus controller by defining commands, protocols, electrical, optical, and/or logical interfaces. In an embodiment, master bus controller may receive intermediate representation 512 and/or output language from logic component 520, wherein output language may include one or more analog-to-digital conversions, low bit rate transmissions, message encryptions, digital signals, binary signals, logic signals, analog signals, and the like thereof described above in detail.

Still referring to FIG. 5, master bus controller may communicate with a slave bus. As used in this disclosure a "slave bus" is one or more peripheral devices and/or components that initiate a bus transfer. For example, and without limitation, slave bus may receive one or more controls and/or asymmetric communications from master bus controller, wherein slave bus transfers data stored to master bus controller. In an embodiment, and without limitation, slave bus may include one or more internal buses, such as but not limited to a/an internal data bus, memory bus, system bus, front-side bus, and the like thereof. In another embodiment, and without limitation, slave bus may include one or more external buses such as external flight controllers, external computers, remote devices, printers, aircraft computer systems, flight control systems, and the like thereof.

In an embodiment, and still referring to FIG. 5, control algorithm may optimize signal communication as a function of determining one or more discrete timings. For example, and without limitation master bus controller may synchronize timing of the segmented control algorithm by injecting high priority timing signals on a bus of the master bus control. As used in this disclosure a "high priority timing signal" is information denoting that the information is important. For example, and without limitation, high priority timing signal may denote that a section of control algorithm is of high priority and should be analyzed and/or transmitted prior to any other sections being analyzed and/or transmitted. In an embodiment, high priority timing signal may include one or more priority packets. As used in this disclosure a "priority packet" is a formatted unit of data that is communicated between the plurality of flight controllers. For example, and without limitation, priority packet may denote that a section of control algorithm should be used and/or is of greater priority than other sections.

Still referring to FIG. 5, flight controller 504 may also be implemented using a "shared nothing" architecture in which data is cached at the worker, in an embodiment, this may enable scalability of aircraft and/or computing device. Flight controller 504 may include a distributer flight controller. As used in this disclosure a "distributer flight controller" is a component that adjusts and/or controls a plurality of flight components as a function of a plurality of flight controllers. For example, distributer flight controller may include a flight controller that communicates with a plurality of additional flight controllers and/or clusters of flight controllers. In an embodiment, distributed flight control may include one or more neural networks. For example, neural network also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 5, a node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above. In an embodiment, and without limitation, a neural network may receive semantic units as inputs and output vectors representing such semantic units according to weights $w_i$ that are derived using machine-learning processes as described in this disclosure.

Still referring to FIG. 5, flight controller may include a sub-controller 540. As used in this disclosure a "sub-controller" is a controller and/or component that is part of a distributed controller as described above; for instance, flight controller 504 may be and/or include a distributed flight controller made up of one or more sub-controllers. For example, and without limitation, sub-controller 540 may include any controllers and/or components thereof that are similar to distributed flight controller and/or flight controller as described above. Sub-controller 540 may include any component of any flight controller as described above. Sub-controller 540 may be implemented in any manner suitable for implementation of a flight controller as described above. As a further non-limiting example, sub-controller 540 may include one or more processors, logic components and/or computing devices capable of receiving, processing, and/or transmitting data across the distributed flight controller as described above. As a further non-limiting example, sub-controller 540 may include a controller that receives a signal from a first flight controller and/or first distributed flight controller component and transmits the signal to a plurality of additional sub-controllers and/or flight components.

Still referring to FIG. 5, flight controller may include a co-controller 544. As used in this disclosure a "co-controller" is a controller and/or component that joins flight controller 504 as components and/or nodes of a distributer flight controller as described above. For example, and without limitation, co-controller 544 may include one or more controllers and/or components that are similar to flight controller 504. As a further non-limiting example, co-controller 544 may include any controller and/or component that joins flight controller 504 to distributer flight controller. As a further non-limiting example, co-controller 544 may include one or more processors, logic components and/or computing devices capable of receiving, processing, and/or transmitting data to and/or from flight controller 504 to distributed flight control system. Co-controller 544 may include any component of any flight controller as described above. Co-controller 544 may be implemented in any manner suitable for implementation of a flight controller as described above.

In an embodiment, and with continued reference to FIG. 5, flight controller 504 may be designed and/or configured to perform any method, method step, or sequence of method steps in any embodiment described in this disclosure, in any order and with any degree of repetition. For instance, flight controller 504 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 6:
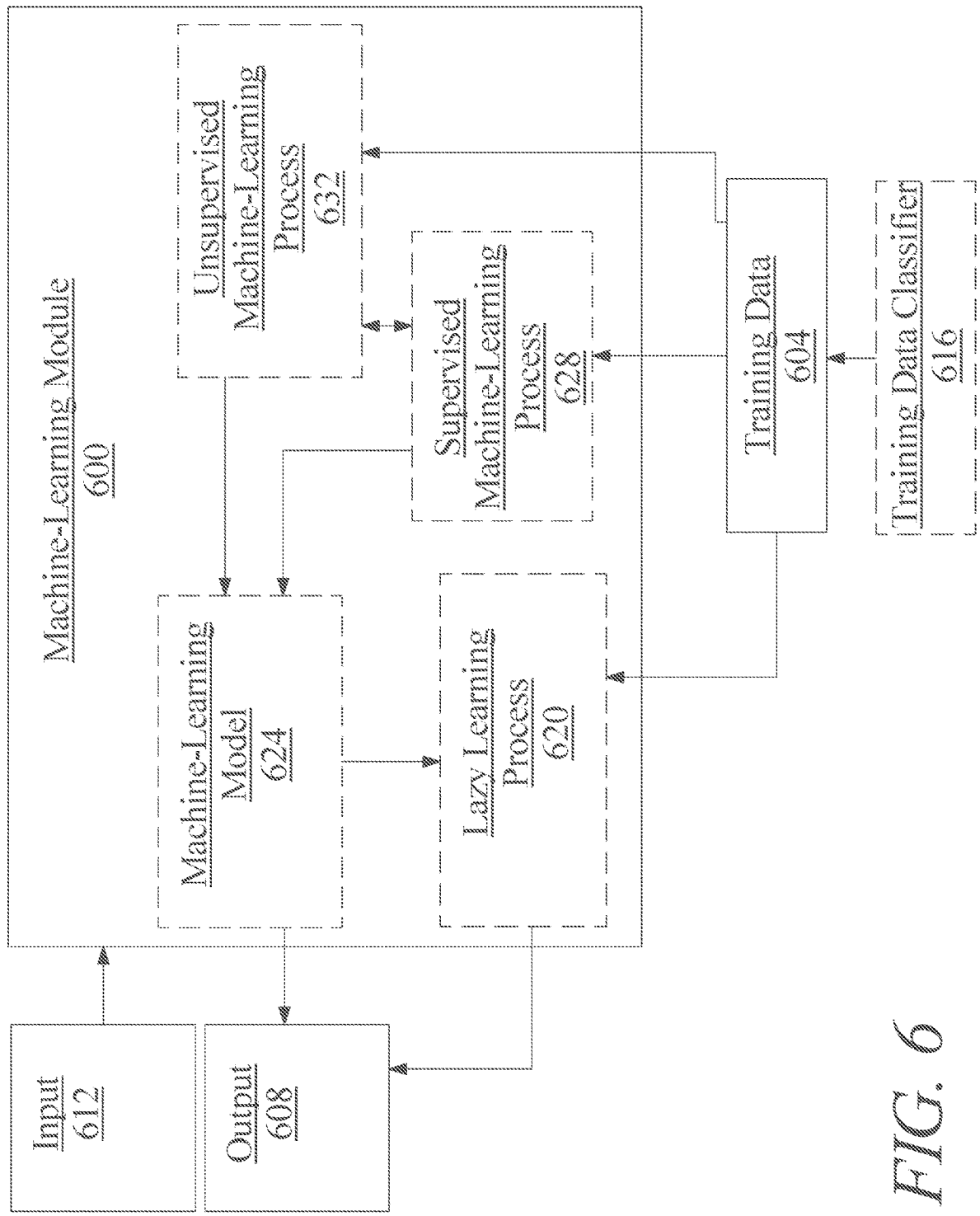
FIG. 6 is a block diagram of an exemplary machine learning module.

Referring now to FIG. 6, an exemplary embodiment of a machine-learning module 600 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 604 to generate an algorithm that will be performed by a computing device/module to produce outputs 608 given data provided as inputs 612; this is in contrast to a non-machine learning software program where the commands to be executed are determined in advance by a user and written in a programming language.

Still referring to FIG. 6, "training data," as used herein, is data containing correlations that a machine-learning process may use to model relationships between two or more categories of data elements. For instance, and without limitation, training data 604 may include a plurality of data entries, each entry representing a set of data elements that were recorded, received, and/or generated together; data elements may be correlated by shared existence in a given data entry, by proximity in a given data entry, or the like. Multiple data entries in training data 604 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 604 according to various correlations; correlations may indicate causative and/or predictive links between categories of data elements, which may be modeled as relationships such as mathematical relationships by machine-learning processes as described in further detail below. Training data 604 may be formatted and/or organized by categories of data elements, for instance by associating data elements with one or more descriptors corresponding to categories of data elements. As a non-limiting example, training data 604 may include data entered in standardized forms by persons or processes, such that entry of a given data element in a given field in a form may be mapped to one or more descriptors of categories. Elements in training data 604 may be linked to descriptors of categories by tags, tokens, or other data elements; for instance, and without limitation, training data 604 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 6, training data 604 may include one or more elements that are not categorized; that is, training data 604 may not be formatted or contain descriptors for some elements of data. Machine-learning algorithms and/or other processes may sort training data 604 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 604 to be made applicable for two or more distinct machine-learning algorithms as described in further detail below. Training data 604 used by machine-learning module 600 may correlate any input data as described in this disclosure to any output data as described in this disclosure. As a non-limiting illustrative example flight elements and/or pilot signals may be inputs, wherein an output may be an autonomous function.

Further referring to FIG. 6, training data may be filtered, sorted, and/or selected using one or more supervised and/or unsupervised machine-learning processes and/or models as described in further detail below; such models may include without limitation a training data classifier 616. Training data classifier 616 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 600 may generate a classifier using a classification algorithm, defined as a processes whereby a computing device and/or any module and/or component operating thereon derives a classifier from training data 604. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 416 may classify elements of training data to sub-categories of flight elements such as torques, forces, thrusts, directions, and the like thereof.

Still referring to FIG. 6, machine-learning module 600 may be configured to perform a lazy-learning process 620 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 604. Heuristic may include selecting some number of highest-ranking associations and/or training data 604 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 6, machine-learning processes as described in this disclosure may be used to generate machine-learning models 624. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 624 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 624 may be generated by creating an artificial neural network, such as a convolutional neural network comprising an input layer of nodes, one or more intermediate layers, and an output layer of nodes. Connections between nodes may be created via the process of "training" the network, in which elements from a training data 604 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 6, machine-learning algorithms may include at least a supervised machine-learning process 628. At least a supervised machine-learning process 628, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include flight elements and/or pilot signals as described above as inputs, autonomous functions as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 604. Persons skilled in the art, upon reviewing the entirety of this disclosure, will be aware of various possible variations of at least a supervised machine-learning process 628 that may be used to determine relation between inputs and outputs. Supervised machine-learning processes may include classification algorithms as defined above.

Further referring to FIG. 6, machine learning processes may include at least an unsupervised machine-learning processes 632. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 6, machine-learning module 600 may be designed and configured to create a machine-learning model 624 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 6, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 7:
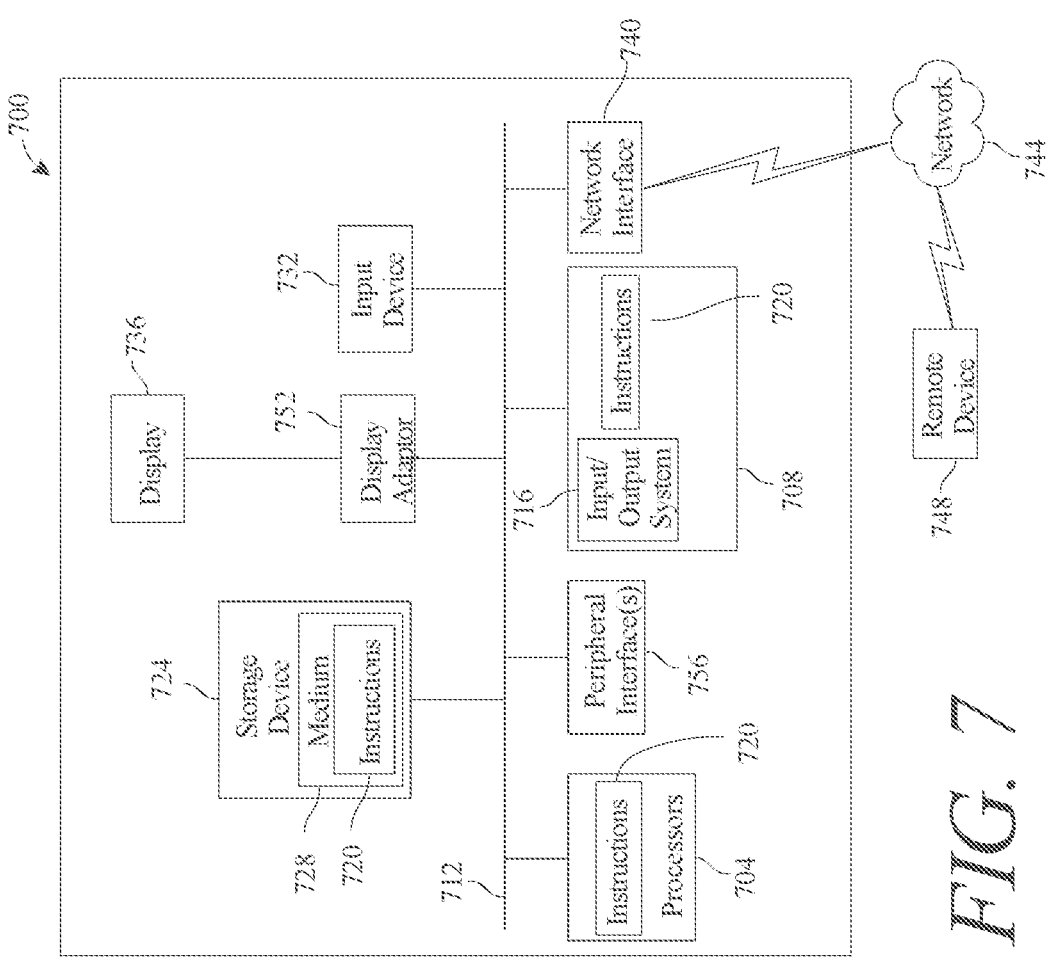
FIG. 7 is a block diagram of a computing system that can be used to implement any one or more of the methodologies disclosed herein and any one or more portions thereof.

FIG. 7 shows a diagrammatic representation of one embodiment of a computing device in the exemplary form of a computer system 700 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 700 includes a processor 704 and a memory 708 that communicate with each other, and with other components, via a bus 712. Bus 712 may include any of several types of bus structures including, but not limited to, a memory bus, a memory controller, a peripheral bus, a local bus, and any combinations thereof, using any of a variety of bus architectures.

Processor 704 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 704 may be organized according to Von Neumann and/or Harvard architecture as a non-limiting example. Processor 704 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 708 may include various components (e.g., machine-readable media) including, but not limited to, a random-access memory component, a read only component, and any combinations thereof. In one example, a basic input/output system 716 (BIOS), including basic routines that help to transfer information between elements within computer system 700, such as during start-up, may be stored in memory 708. Memory 708 may also include (e.g., stored on one or more machine-readable media) instructions (e.g., software) 720 embodying any one or more of the aspects and/or methodologies of the present disclosure. In another example, memory 708 may further include any number of program modules including, but not limited to, an operating system, one or more application programs, other program modules, program data, and any combinations thereof.

Computer system 700 may also include a storage device 724. Examples of a storage device (e.g., storage device 724) include, but are not limited to, a hard disk drive, a magnetic disk drive, an optical disc drive in combination with an optical medium, a solid-state memory device, and any combinations thereof. Storage device 724 may be connected to bus 712 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 724 (or one or more components thereof) may be removably interfaced with computer system 700 (e.g., via an external port connector (not shown)). Particularly, storage device 724 and an associated machine-readable medium 728 may provide nonvolatile and/or volatile storage of machine-readable instructions, data structures, program modules, and/or other data for computer system 700. In one example, software 720 may reside, completely or partially, within machine-readable medium 728. In another example, software 720 may reside, completely or partially, within processor 704.

Computer system 700 may also include an input device 732. In one example, a user of computer system 700 may enter commands and/or other information into computer system 700 via input device 732. Examples of an input device 732 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 732 may be interfaced to bus 712 via any of a variety of interfaces (not shown) including, but not limited to, a serial interface, a parallel interface, a game port, a USB interface, a FIREWIRE interface, a direct interface to bus 712, and any combinations thereof. Input device 732 may include a touch screen interface that may be a part of or separate from display 736, discussed further below. Input device 732 may be utilized as a user selection device for selecting one or more graphical representations in a graphical interface as described above.

A user may also input commands and/or other information to computer system 700 via storage device 724 (e.g., a removable disk drive, a flash drive, etc.) and/or network interface device 740. A network interface device, such as network interface device 740, may be utilized for connecting computer system 700 to one or more of a variety of networks, such as network 744, and one or more remote devices 748 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 744, may employ a wired and/or a wireless mode of communication. In general, any network topology may be used. Information (e.g., data, software 720, etc.) may be communicated to and/or from computer system 700 via network interface device 740.

Computer system 700 may further include a video display adapter 752 for communicating a displayable image to a display device, such as display device 736. Examples of a display device include, but are not limited to, a liquid crystal display (LCD), a cathode ray tube (CRT), a plasma display, a light emitting diode (LED) display, and any combinations thereof. Display adapter 752 and display device 736 may be utilized in combination with processor 704 to provide graphical representations of aspects of the present disclosure. In addition to a display device, computer system 700 may include one or more other peripheral output devices including, but not limited to, an audio speaker, a printer, and any combinations thereof. Such peripheral output devices may be connected to bus 712 via a peripheral interface 756. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods and systems according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions, and additions may be made to that which is specifically disclosed herein without departing from the spirit and scope of the present invention.

What is claimed is:

1. An electric aircraft charging connector, comprising:
   a direct current pin;
   an alternating current pin;
   a ground pin, the ground pin providing a grounded connection;
   a resistance sensor, the resistance sensor electrically connected to the direct current pin, the alternating current pin, and the ground pin, the resistance sensor configured to measure a resistance datum, the resistance datum comprising:
      a first resistance, the first resistance comprising a measurement of resistance between the direct current pin and the ground pin; and
      a second resistance, the second resistance comprising a measurement of resistance between the alternating current pin and the ground pin; and
   a controller, the controller configured to:
      receive the resistance datum from the resistance sensor; and
      compare the resistance datum to a threshold resistance datum.
2. The electric aircraft charging connector of claim 1, comprising a switch, the switch having an engaged state and a disengaged state.
3. The electric aircraft charging connector of claim 2, wherein:
   the switch, in its engaged state, forms an electronic connection to a load; and
   the switch, in its disengaged state, is not electronically connected to the load.
4. The electric aircraft charging connector of claim 3, wherein the load is an energy storage device.
5. The electric aircraft charging connector of claim 2, wherein the switch is a circuit breaker.
6. The electric aircraft charging connector of claim 2, wherein the switch is a relay.
7. The electric aircraft charging connector of claim 2, wherein the controller is further configured to disengage the switch when the resistance datum is less than the threshold resistance datum.
8. The electric aircraft charging connector of claim 7, wherein the controller is further configured to engage the switch in response to a command.
9. The electric aircraft charging connector of claim 8, wherein the command is initiated by a user.
10. The electric aircraft charging connector of claim 7, further comprising a proximity detection pin, and wherein the controller is further configured to:
    receive a current datum from the proximity detection pin; and
    engage the switch when the current datum is zero.
11. The electric aircraft charging connector of claim 7, wherein the controller is further configured to display a visual alert on a display.
12. The electric aircraft charging connector of claim 7, wherein the controller is further configured to send an audio alert.
13. The electric aircraft charging connector of claim 1, wherein the direct current pin comprises a direct current live pin and a direct current neutral pin, the direct current live pin supplying direct current power, the direct current neutral pin providing a return path for the direct current power.
14. The electric aircraft charging connector of claim 1, wherein the alternating current pin comprises an alternating current live pin and an alternating current neutral pin, the alternating current live pin supplying direct current power, the alternating current neutral pin providing a return path for the direct current power.
15. A method of monitoring an electric aircraft charging connector, comprising:
    receiving, by a controller of a charging connector, a first resistance, the first resistance comprising a measurement of resistance between a direct current pin and a ground pin of the charging connector;
    receiving, by the controller, a second resistance, the second resistance comprising a measurement of resistance between an alternating current pin and a ground pin of the charging connector;
    comparing, by the controller, the first resistance to a threshold resistance datum; and
    disengaging, by the controller, a switch if the first resistance is less than the threshold resistance datum.
16. The method of monitoring an electric aircraft charging connector of claim 15, further comprising:
    comparing the second resistance to a threshold resistance datum; and
    disengaging the switch if the second resistance is less than the threshold resistance datum.
17. The method of monitoring an electric aircraft charging connector of claim 16, further comprising engaging the switch in response to a command initiated by a user.
18. The method of monitoring an electric aircraft charging connector of claim 16, further comprising:
    receiving a current datum from a proximity detection pin; and
    engaging the switch if the current datum is zero.
19. The method of monitoring an electric aircraft charging connector of claim 16, further comprising displaying a visual alert on a display.
20. The method of monitoring an electric aircraft charging connector of claim 16, further comprising sending an audio alert.

* * * * *